(12) United States Patent
Smith et al.

(10) Patent No.: US 12,009,127 B2
(45) Date of Patent: ***Jun. 11, 2024

(54) RESISTOR WITH TEMPERATURE COEFFICIENT OF RESISTANCE (TCR) COMPENSATION

(71) Applicant: VISHAY DALE ELECTRONICS, LLC, Columbus, NE (US)

(72) Inventors: Clark L. Smith, Columbus, NE (US);
Thomas L. Bertsch, Norfolk, NE (US);
Todd L. Wyatt, Columbus, NE (US);
Thomas L. Veik, Columbus, NE (US)

(73) Assignee: VISHAY DALE ELECTRONICS, LLC, Columbus, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/158,289

(22) Filed: Jan. 23, 2023

(65) Prior Publication Data

US 2023/0343495 A1 Oct. 26, 2023

Related U.S. Application Data

(63) Continuation of application No. 17/063,235, filed on Oct. 5, 2020, now Pat. No. 11,562,838, which is a
(Continued)

(51) Int. Cl.
*H01C 7/06* (2006.01)
*G01R 1/20* (2006.01)
(Continued)

(52) U.S. Cl.
CPC ............... *H01C 7/06* (2013.01); *G01R 1/203* (2013.01); *G01R 19/0092* (2013.01);
(Continued)

(58) Field of Classification Search
CPC ........ H01C 7/06; H01C 1/148; H01C 17/232; H01C 17/28; G01R 1/203; G01R 19/0092; G01R 19/32
See application file for complete search history.

(56) References Cited

U.S. PATENT DOCUMENTS

| 4,079,349 A | 3/1978 | Dorfeld |
| 4,200,970 A | 5/1980 | Schonberger |

(Continued)

FOREIGN PATENT DOCUMENTS

| CN | 2490589 Y | 5/2022 |
| DE | 202021103627 U1 | 7/2021 |

(Continued)

OTHER PUBLICATIONS magLab, Manganin Shunt Resistor for High Precision Current Measurement, R100-BAR-03 Shunt Resistor, Rev. 006 (Jan. 2018), Available at https://web.archive.org/web/2020*/https://www.maglab.ch/wp-content/uploads/2018/02/20180118_R100-BAR-03_rev006.pdf (Oct. 22, 2020).

(Continued)

*Primary Examiner* — Kyung S Lee
(74) *Attorney, Agent, or Firm* — Volpe Koenig

(57) ABSTRACT

A current sense resistor and a method of manufacturing a current sensing resistor with temperature coefficient of resistance (TCR) compensation are disclosed. The resistor has a resistive strip disposed between two conductive strips. A pair of main terminals and a pair of voltage sense terminals are formed in the conductive strips. A pair of rough TCR calibration slots is located between the main terminals and the voltage sense terminals, each of the rough TCR calibration slots have a depth selected to obtain a negative starting (Continued)

TCR value observed at the voltage sense terminals. A fine TCR calibration slot is formed between the pair of voltage sense terminals.

20 Claims, 4 Drawing Sheets

Related U.S. Application Data continuation of application No. 16/284,592, filed on Feb. 25, 2019, now Pat. No. 10,796,826, which is a continuation of application No. 15/722,536, filed on Oct. 2, 2017, now Pat. No. 10,217,550, which is a continuation of application No. 15/218,219, filed on Jul. 25, 2016, now Pat. No. 9,779,860, which is a continuation of application No. 14/531,505, filed on Nov. 3, 2014, now Pat. No. 9,400,294, which is a continuation of application No. 14/015,488, filed on Aug. 30, 2013, now Pat. No. 8,878,643, which is a continuation of application No. 13/493,402, filed on Jun. 11, 2012, now Pat. No. 8,525,637, which is a continuation of application No. 12/874,514, filed on Sep. 2, 2010, now Pat. No. 8,198,977.

(60) Provisional application No. 61/359,000, filed on Jun. 28, 2010, provisional application No. 61/239,962, filed on Sep. 4, 2009.

(51) Int. Cl.
| | |
|---|---|
| *G01R 19/00* | (2006.01) |
| *G01R 19/32* | (2006.01) |
| *H01C 1/00* | (2006.01) |
| *H01C 1/148* | (2006.01) |
| *H01C 17/232* | (2006.01) |
| *H01C 17/28* | (2006.01) |

(52) U.S. Cl.
CPC ............ *G01R 19/32* (2013.01); *H01C 1/00* (2013.01); *H01C 1/148* (2013.01); *H01C 17/232* (2013.01); *H01C 17/28* (2013.01); *Y10T 29/49082* (2015.01); *Y10T 29/49101* (2015.01)

(56) References Cited

U.S. PATENT DOCUMENTS

| | | | |
|---|---|---|---|
| 4,529,958 | A | 7/1985 | Person |
| 4,620,365 | A | 11/1986 | Burger |
| 4,907,341 | A | 3/1990 | Chapel, Jr. |
| 5,015,989 | A | 5/1991 | Wohlfarth |
| 5,214,407 | A | 5/1993 | McKim, Jr. |
| 5,287,083 | A | 2/1994 | Person |
| 5,604,477 | A | 2/1997 | Rainer |
| 5,621,240 | A | 4/1997 | Ellis |
| 5,815,065 | A | 9/1998 | Hanamura |
| 5,953,811 | A | 9/1999 | Mazzochette |
| 5,999,085 | A | 12/1999 | Szwarc |
| 6,097,276 | A | 8/2000 | Van Den Broek |
| 6,150,920 | A | 11/2000 | Hashimoto |
| 6,181,234 | B1 | 1/2001 | Szwarc |
| 6,189,767 | B1 | 2/2001 | Haspeslagh |
| 6,348,392 | B1 | 2/2002 | Nakayama |
| 6,356,179 | B1 | 3/2002 | Yamada |
| 6,401,329 | B1 | 6/2002 | Smejkal |
| 6,489,693 | B1 | 12/2002 | Hetzler |
| 6,492,896 | B2 | 12/2002 | Yoneda |
| 6,646,430 | B1 | 11/2003 | Skeritt |
| 7,170,295 | B2 | 1/2007 | Hetzler |
| RE39,660 | E | 5/2007 | Szwarc |
| 7,380,333 | B2 | 6/2008 | Tsukada |
| 7,843,309 | B2 | 11/2010 | Zandman |
| 8,031,043 | B2 | 10/2011 | Schultz |
| 8,183,976 | B2 | 5/2012 | Lo |
| 8,198,977 | B2 | 6/2012 | Smith |
| 8,242,878 | B2 | 8/2012 | Smith |
| 8,525,637 | B2 | 9/2013 | Smith |
| 8,581,687 | B2 | 11/2013 | Belman |
| 8,598,976 | B2 | 12/2013 | Hetzler |
| 8,884,733 | B2 | 11/2014 | Hetzler |
| 9,396,849 | B1 | 7/2016 | Wyatt |
| 9,460,834 | B2 | 10/2016 | Croci |
| 9,779,860 | B2 | 10/2017 | Smith |
| 10,163,553 | B2 | 12/2018 | Kameko |
| 10,217,550 | B2 | 2/2019 | Smith |
| 10,438,730 | B2 | 10/2019 | Kao |
| 11,562,838 | B2 * | 1/2023 | Smith ............ H01C 1/00 |
| 2002/0031860 | A1 | 3/2002 | Tanimura |
| 2002/0130761 | A1 | 9/2002 | Tsukada |
| 2004/0216303 | A1 | 11/2004 | Berlin |
| 2004/0263150 | A1 | 12/2004 | Hetzler |
| 2005/0200451 | A1 | 9/2005 | Tsukada |
| 2009/0085715 | A1 | 4/2009 | Zandman |
| 2009/0195348 | A1 | 8/2009 | Smith |
| 2009/0205196 | A1 | 8/2009 | Grudin |
| 2010/0237982 | A1 | 9/2010 | Brackhan |
| 2012/0154104 | A1 | 6/2012 | Hetzler |
| 2013/0181807 | A1 | 7/2013 | Hetzler |
| 2015/0054531 | A1 | 2/2015 | Smith |
| 2019/0326038 | A1 | 10/2019 | Smith |
| 2020/0200799 | A1 | 6/2020 | Hung |
| 2021/0020339 | A1 | 1/2021 | Smith |
| 2022/0057436 | A1 | 2/2022 | Wyatt |

FOREIGN PATENT DOCUMENTS

| | | |
|---|---|---|
| EP | 0605800 B1 | 3/1996 |
| EP | 1313109 A2 | 5/2003 |
| FR | 2529374 A1 | 12/1983 |
| JP | S57-117204 A | 7/1982 |
| JP | H02-110903 A | 4/1990 |
| JP | 03-025994 A | 2/1991 |
| JP | 05-006801 A | 1/1993 |
| JP | 6-267707 A | 9/1994 |
| JP | 11-283802 A | 10/1999 |
| JP | 2000-2639012 A | 9/2000 |
| JP | 2001-1555302 A | 6/2001 |
| JP | 2002-050501 A | 2/2002 |
| JP | 2003197403 A | 7/2003 |
| JP | 2004-047603 A | 2/2004 |
| JP | 2005-181056 A | 7/2005 |
| JP | 2006-1128638 A | 4/2006 |
| JP | 2007-221006 A | 8/2007 |
| JP | 2007329421 A | 12/2007 |
| JP | 2009-141171 A | 6/2009 |
| JP | 2009266977 A | 11/2009 |
| WO | 00-00833 A1 | 1/2000 |
| WO | 2008-0353208 A1 | 4/2008 |
| WO | 2022039808 A1 | 2/2022 |

OTHER PUBLICATIONS

Sabellenhutte, ISA-WELDS—SMD Prazisionswiderstande/SMD precision resistors, Technical Data, Issue 3VR-2005-07-11, 4 pages.
Sabellenhutte, ISA-WELDS—SMD Prazisionswiderstande/SMD precision resistors, Technical Data, Issue 3VR-2008-02-05, 4 pages.
Sabellenhutte, ISA-WELDS—SMD Prazisionswiderstande/SMD precision resistors, Technical Data, Issue 3VR-2009-02-17, 4 pages.
Sabellenhutte "designed for high power" Technical Data (www.isabellenhuette.de) 5 pages.
Bodo's Power System, IGBT Modules, May 2009, p. 39 (www.bodospower.com).
Bodo's Power System, News, Jul. 2009, p. 7 (www.bodospower.com).
Gopfrich et al., "Shunt Current Measuring up to 800A in the Inverter," Inverter Design published by Power Electronics Europe, Issue 7 2009, pp. 20 and 21 (www.isabellenhuette.de).

(56) References Cited

OTHER PUBLICATIONS

Sabellenhutte, ISA-PLAN®—Prazisionswiderstande/precision resistors, Typ/type PMU, Issue: May 1999, 3 pages.
Sabellenhutte, ISA-WELDS—SMD Prazisionswiderstande/SMD precision resistors, Technical Data, Issue 3VB-2008-02-05, 4 pages.
Sabellenhutte, ISA-PLANT-ISA-WELDe-technology: Precision and power resistors for highest requirements, The m0-concept, Issue May 2007, 6 pages.
Sabellenhutte, ISA-WELD® Precision and power resistors, Optimized shunts for energy metering market, Issue Oct. 2008, 2 pages.
Sabellenhutte, ISA-PLAN®—Prazisionswiderstande precision resistors, Typ/type BVR, Technical Data, Issue Jan. 2004, 3 pages.
Sabellenhutte, ISA-WELD® Precision and power resistors made of composite materials, SMD-Shunts for high current applications, Issue May 2005, 2 pages.
Jower Electronics Europe, Inverter Design "Shunt Current Measuring up to 800A in the Inverter," Issue 7 2009, 4 pages.
Sabellenhutte, designed for high power, electronica 2004, Munich, Germany (Nov. 9-12), 5 pages.
Declaration Under 37 CFR 1.131 of Ullrich Hetzler, filed in U.S. Appl. No. 13/819,020, dated Jul. 10, 2014, 4 pages.
Sabellenhutte, ISA-PLAN®—SMD precision resistors, Technical Data, Issue PMB-2005-12-12, 4 pages.
Sabellenhutte, ISA-WELDS—SMD Prazisionswiderstande/SMD precision resistors, Technical Data, Issue 3V0-2008-10-22, 4 pages.
Sabellenhutte, ISA-PLAN®—SMD Prazisionswiderstande/SMD precision resistors, Technical Data, Issue MU-2009-05-08, 4 pages.
Sabellenhutte Resistors Selection Guide, Issue Apr. 2009, 10 pages.

* cited by examiner

RESISTOR WITH TEMPERATURE COEFFICIENT OF RESISTANCE (TCR) COMPENSATION

CROSS REFERENCE TO RELATED APPLICATIONS

This application is a continuation of U.S. patent application Ser. No. 17/063,235, filed Oct. 5, 2020, which issued as U.S. Pat. No. 11,562,838 on Jan. 24, 2023, which is a continuation of U.S. patent application Ser. No. 16/284,592, filed Feb. 25, 2019, which issued as U.S. Pat. No. 10,796,826 on Oct. 6, 2020, which is a continuation of U.S. patent application Ser. No. 15/722,536, filed Oct. 2, 2017, which issued as U.S. Pat. No. 10,217,550 on Feb. 26, 2019, which is a continuation of U.S. patent application Ser. No. 15/218,219, filed Jul. 25, 2016, which issued as U.S. Pat. No. 9,779,860 on Oct. 3, 2017, which is a continuation of U.S. patent application Ser. No. 14/531,505, filed Nov. 3, 2014, issued as U.S. Pat. No. 9,400,294 on Jul. 26, 2016, which is a continuation of U.S. patent application Ser. No. 14/015,488, filed Aug. 30, 2013, issued as U.S. Pat. No. 8,878,643 on Nov. 4, 2014, which is a continuation of U.S. patent application Ser. No. 13/493,402, filed Jun. 11, 2012, issued as U.S. Pat. No. 8,525,637 on Sep. 3, 2013, which is a continuation of U.S. patent application Ser. No. 12/874,514, filed Sep. 2, 2010, issued as U.S. Pat. No. 8,198,977 on Jun. 12, 2012, which claims the benefit of U.S. Provisional Application No. 61/359,000, filed Jun. 28, 2010, and U.S. Provisional Application No. 61/239,962, filed Sep. 4, 2009, the entire contents of all of which are hereby incorporated by reference as if fully set forth herein.

FIELD OF THE INVENTION

The present invention relates to a four terminal current sense resistor of very low ohmic value and high stability.

BACKGROUND

Surface mounted current sense resistors have been available for the electronic market for many years. Their construction typically includes a flat strip of a resistive material that is coupled between high conductivity metal terminals forming the main terminals of the device. A pair of voltage sense terminals can be formed in the main terminals thereby creating a four terminal device. The main terminals carry the majority of the current through the device. The voltage sense terminals produce a voltage that is proportional to the current passing through the device. Such devices provide a mechanism to monitor the current passing through a given circuit using conventional voltage sensing techniques. The actual current passing through the device can be determined based on the sensed voltage and the resistance value of the device as dictated by ohms law. An ideal device would have a Temperature Coefficient of Resistance (TCR) that is close to zero. However, most devices have a non-zero TCR that can lead to inaccurate voltage readings at the voltage sense terminals particularly when the temperature of the device varies.

In low ohmic current sense resistors and high current shunts, the resistive element length is short while the length of the resistor is a standard length, or in the case of high current shunts long because of the application. The long resistor length and short resistive element length causes a significant amount of copper termination metal to be in the current path. Copper has a TCR of 3900 ppm/° C. while the resistive material is typically less than 100 ppm/° C. The added copper in the current path drives the overall TCR of the resistor to values that can be in the 800 ppm/° C. range or greater, versus a desired TCR of less than 100 ppm/° C.

As noted above, typical current sense resistors have four terminals, two main terminals and two voltage sense terminals, separated by two slots. The length of two slots is manipulated to adjust TCR. See U.S. Pat. No. 5,999,085 (Szwarc). This method does not lend itself to conventional resistor calibration equipment such as a laser or other cutting techniques that are typically used to reduce the width of the resistive element to increase the resistor's resistance value.

What is needed is an improved configuration and method of making a current sense resistor with TCR compensation or adjustment. It would also be desirable to provide an improved resistor configuration and method that simplifies TCR adjustment of current sense resistor during the manufacturing process. One or more of these aspects will become apparent from the specification and claims that follow.

SUMMARY

A resistor and a method of manufacturing a resistor with temperature coefficient of resistance (TCR) compensation are disclosed. The resistor has a resistive strip disposed between two conductive strips. A pair of main terminals and a pair of voltage sense terminals are formed in the conductive strips. A pair of rough TCR calibration slots is located between the main terminals and the voltage sense terminals, each of the rough TCR calibration slots have a depth selected to obtain a negative starting TCR value observed at the voltage sense terminals. A fine TCR calibration slot is formed between the pair of voltage sense terminals. The fine TCR calibration slot has a depth selected to obtain a TCR value observed at the voltage sense terminals that approaches zero. The resistor can also have a resistance calibration slot located between the pair of main terminals. The resistance calibration slot has a depth selected to calibrate a resistance value of the resistor.

DETAILED DESCRIPTION OF THE PREFERRED EMBODIMENTS

Figure 1:
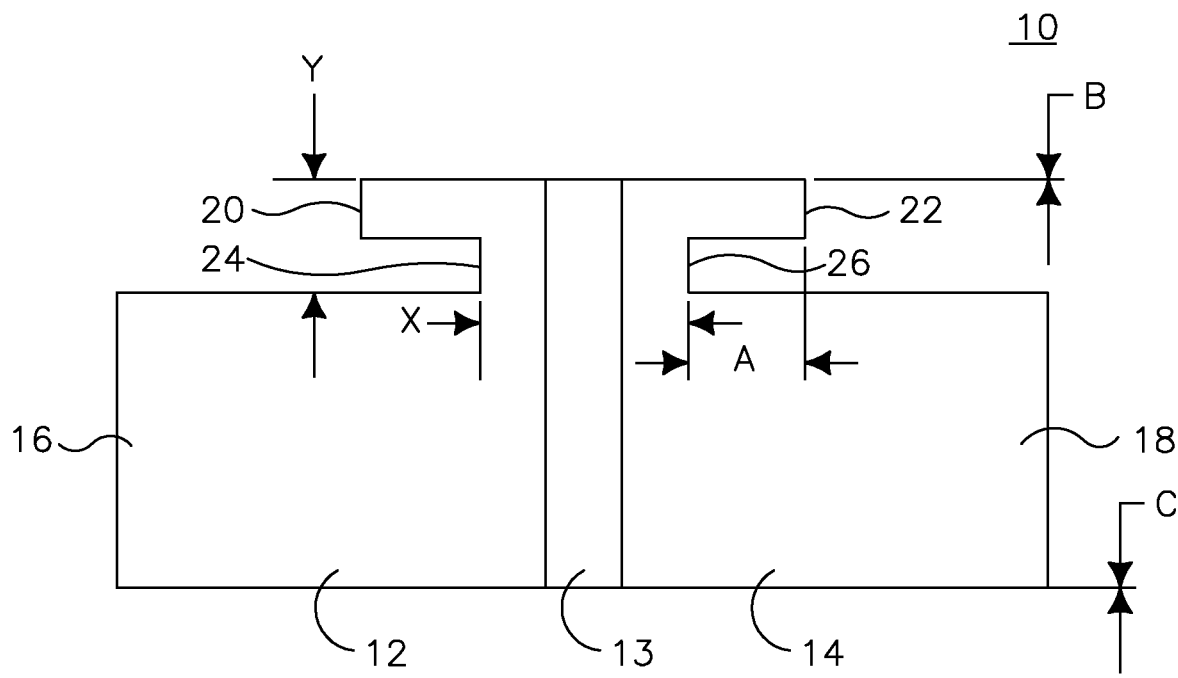
FIG. 1 illustrates a four terminal resistor with a pair of first slots configured to adjust TCR to a negative starting value.
Figure 2:
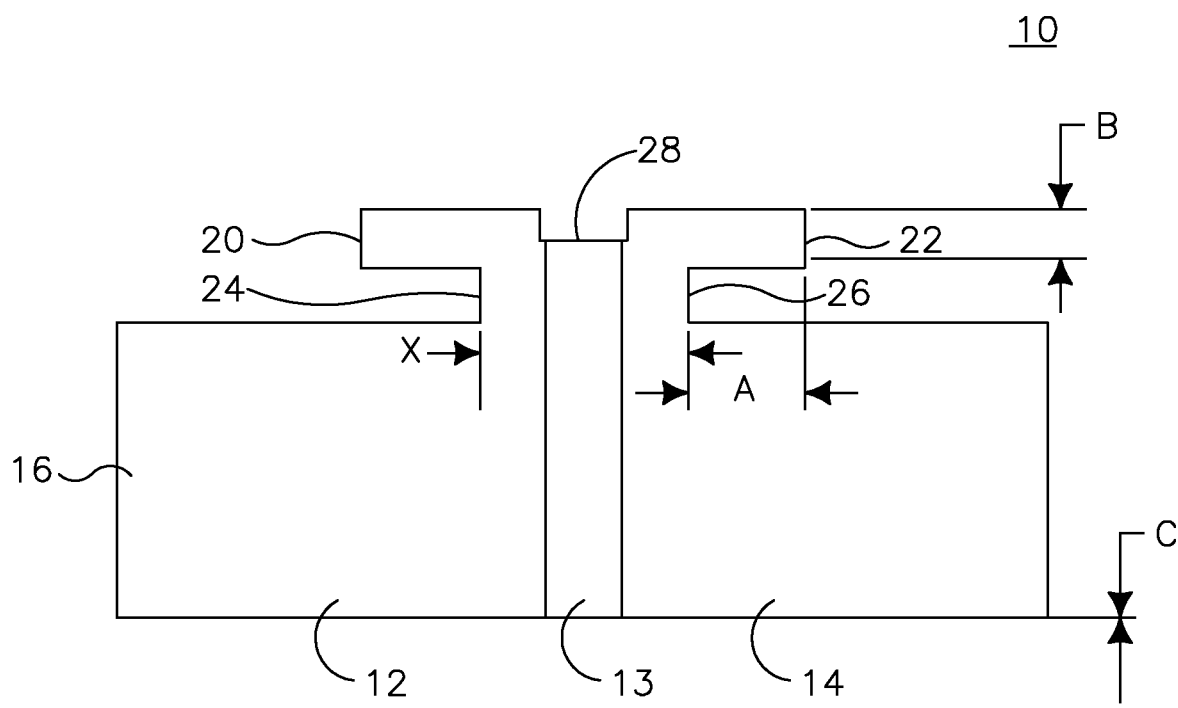
FIG. 2 illustrates a four terminal resistor with a pair of first slots and a second slot configured to collectively adjust TCR to a minimum value.
Figure 3:
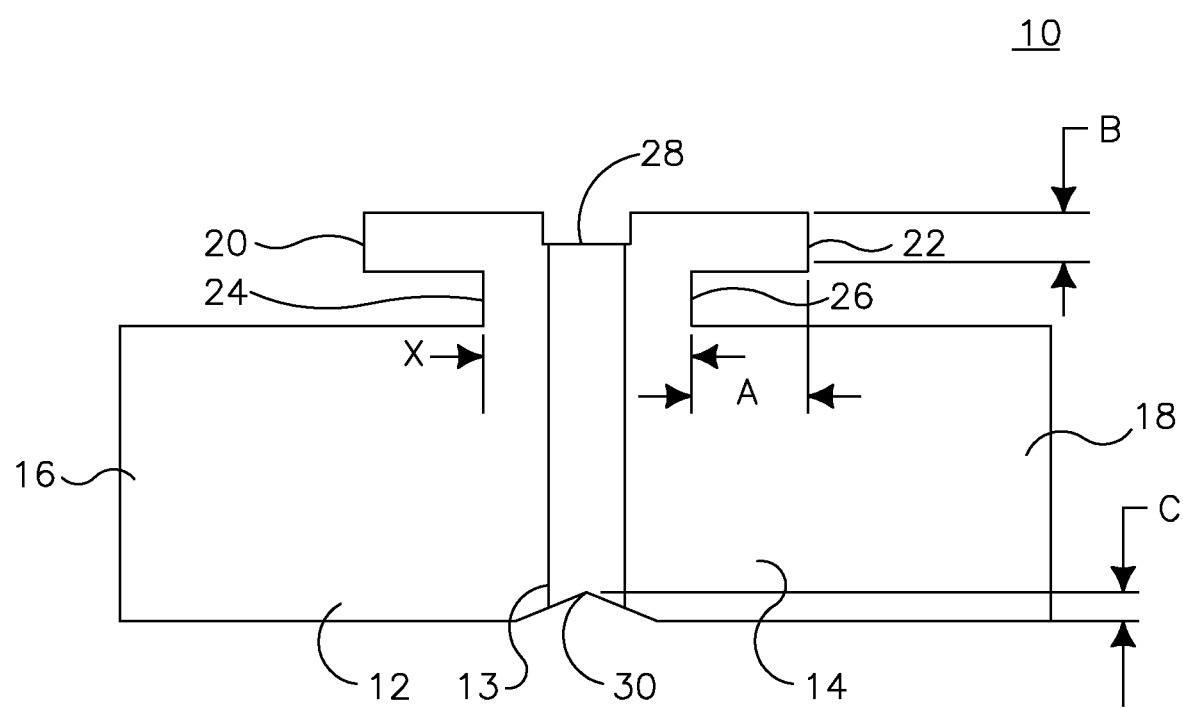
FIG. 3 illustrates a four terminal resistor with a pair of first slots and a second slot configured to collectively adjust TCR to a minimum value and a third slot configured for resistance calibration.

FIGS. 1-3 show exemplary resistor geometries through various stages of adjustment of the Temperature Coefficient of Resistance (TCR). It is understood that the techniques disclosed herein could also apply to other resistor types including film resistors, metal foil resistors and other types of resistor technologies.

FIG. 1, shows a resistor 10 generally formed of a resistive strip 13 disposed between two conductive strips 12, 14. The resistor 10 has main terminals 16, 18 and voltage sense terminals 20, 22. In operation, the main terminals 16, 18 carry the majority of the current passing through the resistor. A pair of first slots 24, 26 is located between the main terminals and the voltage sense terminals. First slots 24, 26 each have an associated depth that extends towards the resistive strip 13. This is shown generally as depth A. It is understood that each first slot 24, 26 can use the same depth A, or in the alternative, first slots 24 and 26 can have different depths. FIGS. 2 and 3 show the formation of a second slot having a depth B and a third slot having a depth C. The relationship between these slots will be discussed below.

Returning to FIG. 1, the conductive strips are generally formed of copper sheet material and have a thickness typically in the range of about 0.008-0.120 inches (~0.2-3 mm). The thickness of the copper is generally selected based on the desired power dissipation of the device and the desired mechanical strength (e.g., so that the resistor has sufficient strength during manufacture, installation and use).

The pair of first slots 24, 26 partition off a portion of the conductive strips 12, 14 and create a four terminal device. The size and location of the pair of first slots 24, 26 generally define the dimensions of the main terminals 16, 18 and the voltage sense terminals 20, 22. The pair of first slots 24, 26 is generally located towards one edge of the resistor. In this example, the pair of first slots 24, 26 are located a distance Y measured from the upper edge of the device. The Y distance is generally selected to yield appropriately sized voltage sense terminals. For example, the Y distance can be selected to provide voltage sense terminals of sufficient width to withstand punching or machining operations during manufacture and to have sufficient strength during installation and use.

The first slots 24, 26 each have a depth generally shown as distance A in FIG. 1. In most applications first slots 24, 26 will have the same depth A. It is understood that first slots 24 and 26 could each be associated with a different depth. It is also understood that the depth associated with first slots 24, 26 could be referenced from a variety of points on the device. Generally, the pair of first slots 24, 26 defines a reduced thickness or neck between the main terminals 16, 18 and the voltage sense terminals 20, 22. This is shown generally as the distance X in FIG. 1. A description of how the first slot depth A is determined is set out below.

In the following example, conductive strips 12, 14 are formed of copper. As noted above, copper has a TCR of 3900 ppm/° C. In contrast, the resistive strip 13 may have a TCR of less than 100 ppm/° C. In absence of the pair of first slots 24, 26, the resistor 10 would typically have a very high, positive TCR due to the large amount of copper disposed in the current path. It is generally desirable to minimize the TCR (i.e., a TCR having an absolute value approaching zero). A typical range for a given current sense resistor may be ±25 ppm/° C. Assume for this example that a given device has a target resistance value of 200µΩ (i.e., 0.00020). Also assume that the initial design without the pair of first slots 24, 26 yields a device with a TCR of approximately 800 ppm/° C.

The thickness of the copper conductive strips 12, 14 is selected as discussed above. The dimensions of the resistive strip 13 are selected to yield a resistance that is close to but below the target resistance value. This is done because the final resistance value will be set by a subsequent trimming operation (which will increase the resistance value of the resistor).

Aside from defining the dimensions of the voltage sense terminals, the pair of first slots 24, 26 causes the TCR at the voltage sense terminals 20, 22 to become more negative. The deeper the pair of first slots 24, 26, the more negative the TCR at the voltage sense terminals 20, 22 becomes. The pair of first slots 24, 26 does not significantly alter the TCR of the resistor itself, rather the pair of first slots 24, 26 alter the TCR observed at the voltage sense terminals 20, 22.

Typically, the relationship between the first slot depth A, and the TCR observed at the voltage sense terminals 20, 22 is determined via a prototyping process. For example, a prototype device is manufactured and then tested using conventional methods (i.e., the voltage, current and temperature is measured through a range of conditions). The depth of the first slots 24, 26 is successively increased until a negative starting TCR value is observed at the voltage sense terminals 20, 22, for example approximately −200 ppm/° C. Thus, first and second slots 24, 26 can be thought of as rough TCR calibration slots.

A negative starting TCR value is desirable at this stage because a second slot will be used to fine tune the TCR value as discussed in more detail below. Once the proper first slot depth is determined, this depth is not altered for a particular style of product (i.e., resistors having the same physical and electrical characteristics). This is advantageous since the pair of first slots 24, 26 can be inserted early in the manufacturing process using conventional punching, end milling or other machining techniques. Subsequent slotting operations can be then carried out later in the manufacturing process and can even be accomplished via laser trimming.

Figure 4:
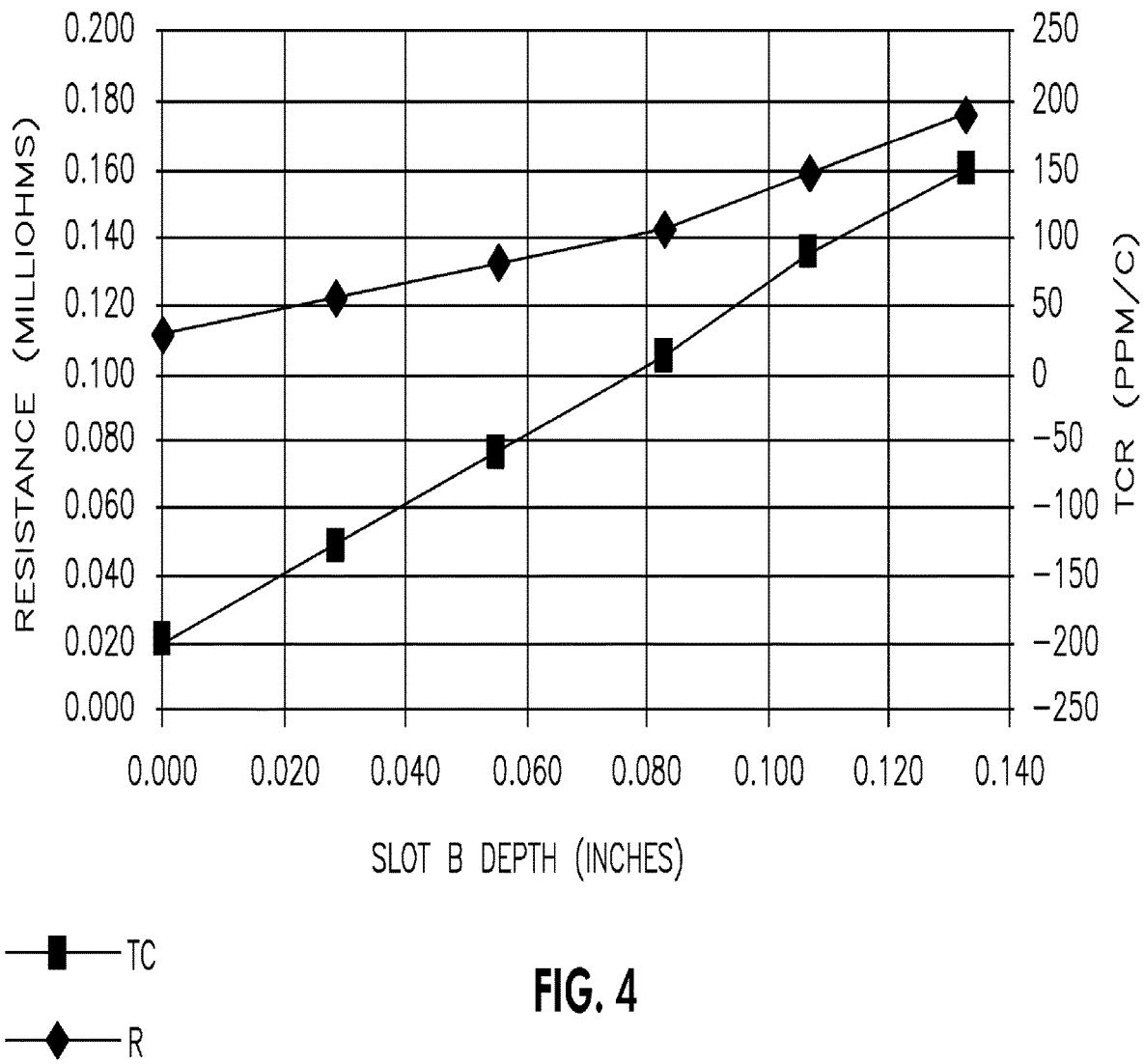
FIG. 4 is a graph showing the relationship between the second slot depth and TCR and resistance value.

Turning to FIG. 2, a second slot 28 having a depth B is shown located between the voltage sense terminals 20, 22. In general, the second slot 28 is formed in the resistive strip 13 between the voltage sense terminals 20, 22. It is understood that the second slot can also result in the removal of a portion of the voltage sense terminals 20, 22, as shown in FIG. 2. The net effect of the second slot 28 is to drive the TCR observed at the voltage sense terminals 20, 22 positive. The second slot 28 will also cause a small increase in resistance value. This is shown graphically in FIG. 4. In this example, the TCR of the resistor without a second slot 28 (e.g., as shown in FIG. 1) is −198 ppm/° C. The initial resistance of the device (without second slot 28) is approximately 110µΩ (i.e., 0.000110). With the second slot depth set to 0.040" (~1 mm) the TCR improves to −100 ppm/° C. Similarly, the resistance increases to approximately 125µΩ (i.e., 0.0001250).

Turing to FIG. 3, with the second slot 28 set to at 0.080" (~2 mm) the TCR continues to become more positive and approaches zero. The resistance increases to approximately 140µΩ (i.e., 0.000140). Thus, the second slot 28 functions as a fine TCR calibration slot. As noted above, a typical target range for TCR range for a given device would be approximately ±25 ppm/° C. The second slot 28 can be formed using laser trimming techniques, conventional punching, end milling or any other machining technique that will permit removal of material to a desired depth and width.

FIG. 3 also shows a third slot 30 (resistance calibration slot) formed between main terminals 16, 18. The third slot 30 has a depth that is selected to fine tune the resistor value. In this case the depth C is selected to yield a target resistance value within specified tolerance (e.g., 200µΩ±1%). The third slot 30 can be formed using laser trimming techniques, conventional punching, end milling or any other machining technique techniques that will permit removal of material to a desired depth and width.

It is understood that the first slots 24, 26 and the second slot 28 can be formed at the same time or at separate times. It is also understood that the second slot 28 can be changed "on the fly" (e.g., if TCR is measured on a resistor by resistor basis). Thus, the TCR of each resistor could be customized to a specified value. As an added advantage, the second slot 28 can be formed using laser trimming techniques which can greatly simplify the TCR adjustment process. First slots 24, 26 and second slot 28 shown in FIGS. 1 and 2 have a generally rectangular profile. Third slot 30 shown in FIG. 3 has a generally triangular profile. It should be understood that other simple or complex geometric slot profiles could be used without departing from the scope of this disclosure.

Figure 5:
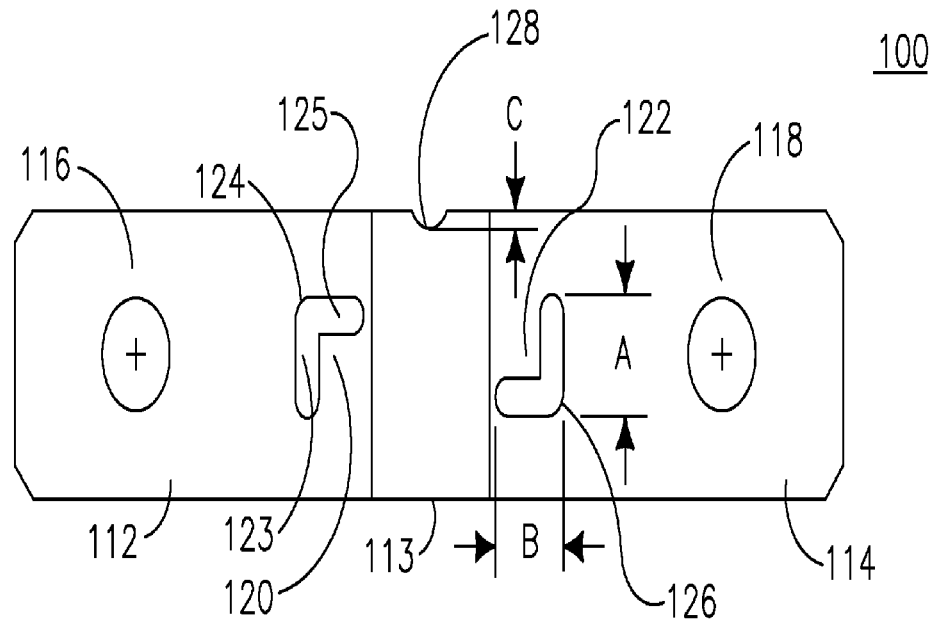
FIG. 5 illustrates another embodiment of a four terminal resistor with TCR compensation.

FIG. 5 shows another slot configuration for TCR compensation. FIG. 5 shows a resistor 100 generally formed of a resistive strip 113 disposed between two conductive strips 112, 114. The conductive strips are generally formed of copper sheet material and have a thickness typically in the range of about 0.008-0.120 inches (~0.2-3 mm). The thickness of the copper is generally selected based on the desired power dissipation of the device and the desired mechanical strength (e.g., so that the resistor has sufficient strength during manufacture, installation and use).

The resistor 100 has main terminals 116, 118 and voltage sense terminals 120, 122. In operation, the main terminals 116, 118 carry the majority of the current passing through the resistor. The main terminals are formed with a defined internal area (e.g., spaced away from the edges of the conductive strips 112, 114). A pair of first slots 124, 126 is located between the main terminals and the voltage sense terminals. In this embodiment the voltage sense terminals are formed within the defined internal area of the main terminals. This configuration is desirable for applications requiring more compact and centrally located voltage sense terminals. First slots 124, 126 are formed with two legs. First leg 123 has a length that extends generally orthogonal to the main current path as shown by "A." Second leg 125 has a length extends generally parallel to the main current path as shown by "B." It is understood that first slots 124 and 126 can use the same leg lengths A and B. In the alternative, first slots can have different leg lengths. The resistor 100 also has a second slot 128 having a depth C. The relationship between these slots will be discussed below.

The pair of first slots 124, 126 partition off an internal portion of the conductive strips 112, 114 and create a four terminal device. The size and location of the pair of first slots 124, 126 generally define the dimensions of the voltage sense terminals 120, 122. In this example, the sense terminals are located generally in the junction between the first and second legs 123, 125.

Figure 6:
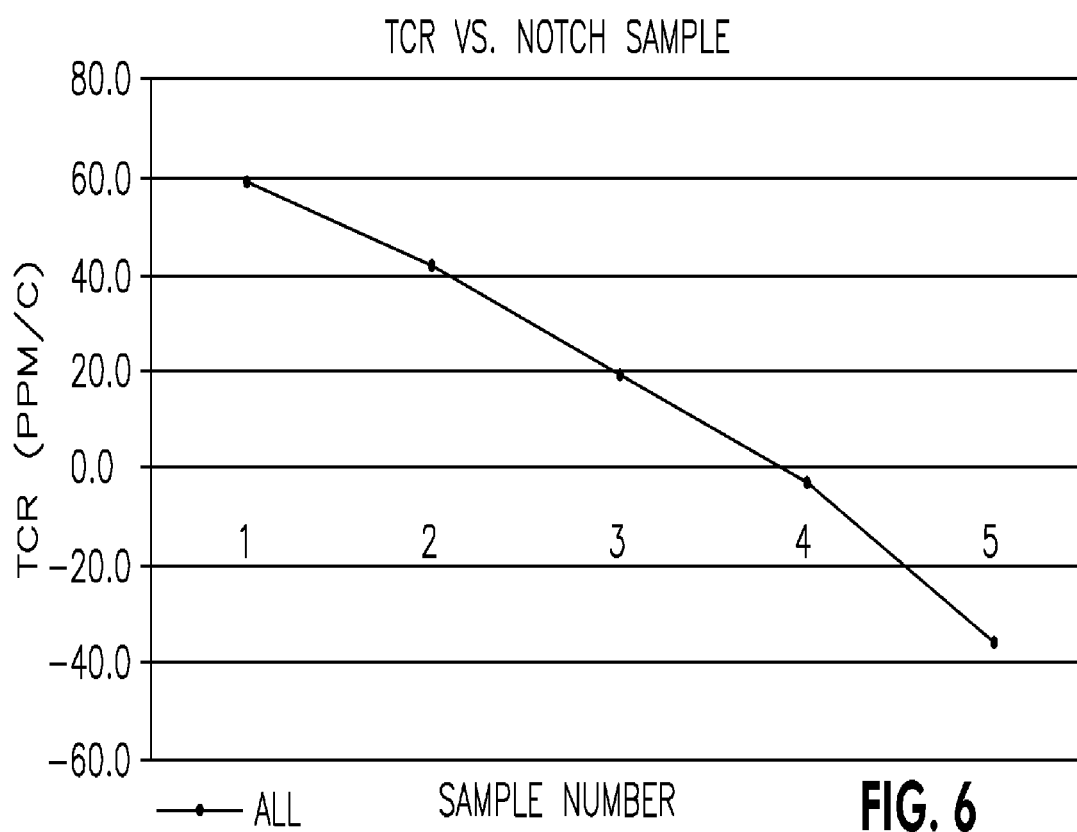
FIG. 6 is a graph showing the TCR compensation associated with the various slot formations.

As discussed above, the first leg 123 has a length A and the second leg 125 has a length B. FIG. 6 is a graph showing the TCR compensation associated with the formation of the first slots 124, 126. Sample 1 is a baseline resistor configured without first slots 124, 126. In this configuration, the TCR is +60 ppm/° C. Samples 2 and 3 show TCR compensation as the first legs 123 are added (Sample 2) and increased in length (Sample 3). As shown on the graph, the TCR becomes more negative ending at +20 ppm/° C. Samples 4 and 5 show TCR compensation as the second legs 125 are added (Sample 4) and increased in length (Sample 5). First legs 123 remain constant in samples 4 and 5. As shown on the graph, the TCR becomes more negative ending at approximately −35 ppm/° C.

During manufacturing, the first leg 123 can be inserted first until a rough level of TCR compensation is achieved. First legs can be formed by a variety of methods including punching or machining. The second leg 125 can be then inserted to fine tune the TCR compensation to the desired level, Second legs can be formed by a variety of methods including laser trimming. In most applications first slots 124, 126 will have the same dimensions. It is understood that first slots 124 and 126 could each be associated with other leg configurations. Once the first slots 124 and 126 are completed, second slot 128 can be formed to fine tune the resistance value. First slots 124, 126 and first and second legs 123, 125 as shown in FIG. 5 have a generally rectangular profile. Second slot 125 shown in FIG. 5 has a generally rounded profile. It should be understood that other simple or complex geometric slot or leg profiles could be used without departing from the scope of this disclosure.

Based on the foregoing it is readily apparent that a variety of modifications are possible without departing from the scope of the invention. For example the first slots 24, 26, 124, 126 can have varied spacing and depths. Similarly, variations in the location of the other slots and the shape of the various terminals are possible. Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. It is intended in the appended claims to cover all those changes and modifications which fall within the true spirit and scope of the present invention.

What is claimed is:

1. A resistor having temperature coefficient of resistance (TCR) compensation, comprising:
   a resistive element;
   a first conductive portion connected to a first side of the resistive element, the first conductive portion having a first sensing portion adjacent to a first slot extending through the first conductive portion, the first sensing portion being located at least in part between the first slot and the resistive element,
   the first slot being formed in an interior area of the first conductive portion bounded on all sides by the interior area, the first slot comprising a first portion and a second portion which are located at different positions relative to the first sensing portion, the first portion and the second portion connected with each other, the first portion extending along a first path and ending with a closed end, the second portion extending along a second path in a direction at least partially toward the resistive element and ending with a closed end, wherein the second path is different than the first path; and
   a second conductive portion connected to a different side of the resistive element than the first conductive portion, the second conductive portion having a second sensing portion.

2. The resistor according to claim 1, wherein the at least a portion of the first sensing portion is located adjacent a position where the first portion of the first slot and the second portion of the first slot connect.

3. The resistor according to claim 1, wherein the first conductive portion defines a main current path, wherein the first slot has at least a portion that extends generally orthogonal to the main current path, and the first slot has at least a portion that extends generally parallel to the main current path.

4. The resistor according to claim 1, wherein the first slot has a portion that is generally C-shaped or L-shaped.

5. The resistor according to claim 1, wherein at least one of the first portion of the first slot or the second portion of the first slot has at least a portion that is generally rounded.

6. The resistor according to claim 1, wherein the first sensing portion is located between at least a portion of the first slot and the resistive element.

7. The resistor according to claim 1, wherein the second conductive portion has a second slot.

8. The resistor according to claim 7, wherein the second slot comprises a third portion and a fourth portion which are located adjacent the second sensing portion, the third portion and the fourth portion connected with each other, the third portion extending along a third path at least partially toward the resistive element, and the fourth portion extending along a fourth path in a direction at least partially different than the third path.

9. The resistor according to claim 8, wherein the at least a portion of the second sensing portion is located adjacent a position where the third portion and the fourth portion connect.

10. The resistor according to claim 8, wherein the second conductive portion defines a main current path, wherein the second slot has at least a portion that extends generally orthogonal to the main current path, and the second slot has at least a portion that extends generally parallel to the main current path.

11. The resistor according to claim 7, wherein the second slot has a portion that is generally C-shaped or L-shaped.

12. The resistor according to claim 8, wherein at least one of the third portion of the second slot or the fourth portion of the second slot has at least a portion that is generally rounded.

13. The resistor according to claim 8, wherein at least one of the first slot or the second slot is configured to adjust a TCR value of the resistor.

14. The resistor according to claim 8, wherein the second slot is formed in an interior area of the second conductive portion, and wherein the second slot is bounded on all sides by the interior area.

15. The resistor according to claim 7, wherein the second sensing portion is located between at least a portion of the second slot and the resistive element.

16. A resistor having temperature coefficient of resistance (TCR) compensation, comprising:

a resistive element;
a first conductive portion connected to a side of the resistive element;
a first slot formed in an interior area of the first conductive portion, the first slot having a first portion and a second portion extending in different directions, the first portion and the second portion defining a first sensing portion;
a second conductive portion connected to another side of the resistive element; and
a second slot formed in an interior area of the second conductive portion, the second slot having a third portion and a fourth portion extending in different directions, the third portion and the fourth portion defining a second sensing portion;
wherein the first slot and the second slot are on opposite sides of the resistive element, and wherein at least one of the first slot or the second slot is configured to adjust a TCR value of the resistor.

17. The resistor according to claim 16, wherein at least a portion of the first slot or the second slot is at least partially rounded.

18. The resistor according to claim 16, wherein the first slot is formed in an interior area of the first conductive portion, and wherein the first slot is bounded on all sides by the interior area, and wherein the second slot is formed in an interior area of the second conductive portion, and wherein the second slot is bounded on all sides by the interior area.

19. The resistor according to claim 16, wherein the first conductive portion and the second conductive portion each define a main current path, wherein the first slot has at least a portion that extends generally orthogonal to the main current path of the first conductive portion, the first slot has at least a portion that extends generally parallel to the main current path of the first conductive portion, the second slot has at least a portion that extends generally orthogonal to the main current path of the second conductive portion, and the second slot has at least a portion that extends generally parallel to the main current path of the second conductive portion.

20. The resistor according to claim 16, wherein the first sensing portion and the second sensing portion are aligned along a longitudinal axis of the resistor.

* * * * *